(12) United States Patent
Yamamoto

(10) Patent No.: US 7,282,383 B2
(45) Date of Patent: Oct. 16, 2007

(54) MICROMACHINE PRODUCTION METHOD

(75) Inventor: Yuichi Yamamoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/864,841

(22) Filed: Jun. 9, 2004

(65) Prior Publication Data

US 2005/0003566 A1   Jan. 6, 2005

(30) Foreign Application Priority Data

Jun. 10, 2003  (JP) ............................ P2003-164946

(51) Int. Cl.
*H01L 21/302* (2006.01)

(52) U.S. Cl. .................... 438/53; 438/693; 257/419; 257/E21.237; 333/133; 333/186

(58) Field of Classification Search .................. 438/53, 438/693; 257/419, E21.237, 133, 186
See application file for complete search history.

(56) References Cited

U.S. PATENT DOCUMENTS

| | | | | |
|---|---|---|---|---|
| 5,914,275 | A * | 6/1999 | Kodera et al. | 438/693 |
| 6,048,775 | A * | 4/2000 | Yao et al. | 438/427 |
| 6,242,805 | B1 * | 6/2001 | Weling | 257/752 |
| 6,628,177 | B2 * | 9/2003 | Clark et al. | 333/186 |
| 2002/0125030 | A1 * | 9/2002 | Yoon et al. | 174/52.4 |
| 2003/0003612 | A1 * | 1/2003 | Lee | 438/21 |
| 2003/0017705 | A1 * | 1/2003 | Rooyackers | 438/692 |

OTHER PUBLICATIONS

G. Schwartz, "Handbook of Semiconductor Interconnection Technology," 2nd Edition, pp. 443-447.*

* cited by examiner

*Primary Examiner*—B. William Baumeister
*Assistant Examiner*—Steven J. Fulk
(74) *Attorney, Agent, or Firm*—Sonnenschein Nath & Rosenthal LLP

(57) ABSTRACT

In a production method of a micromachine having a space between first and second electrodes, a first electrode is formed on a substrate, and then a stopper film is formed on its surface. Next, a second insulating film is formed as to cover the stopper film. The thickness of the second insulating film is larger than a total thickness of the first electrode and stopper film. Then, second insulating film is polished. By this polishing, the stopper film is exposed to the outside to the outside, and is planarized. After forming an opening in the stopper film, a sacrifice film is burred in the opening. Surfaces of the sacrifice film and second insulating film are planarized, and a second electrode is formed on the second insulating film as to cross the sacrifice film. A space is formed between the first and second electrodes by removing the sacrifice film.

4 Claims, 5 Drawing Sheets

MICROMACHINE PRODUCTION METHOD

RELATED APPLICATION DATA

The present application claims priority to Japanese Application(s) No(s). P2003-164946 filed Jun. 10, 2003, which application(s) is/are incorporated herein by reference to the extent permitted by law.

BACKGROUND OF THE INVENTION

1. Field of the Invention

The present invention relates to a micromachine production method, and more particularly, to a micromachine having a frequency filter function and being capable of integrating into a semiconductor device, and a production method thereof.

2. Description of the Related Art

A microvibrator fabricated using a semiconductor process technology has features to ensure that an area occupied by each element is of small size, high quality factors (Q factors) are available and integration with other semiconductor devices is possible. Research organizations including University of Michigan have proposed to use the microvibrator as radio communication devices such as IF filters and RF filters, for instance. See Non-patent document 1, for instance.

Figure 1:
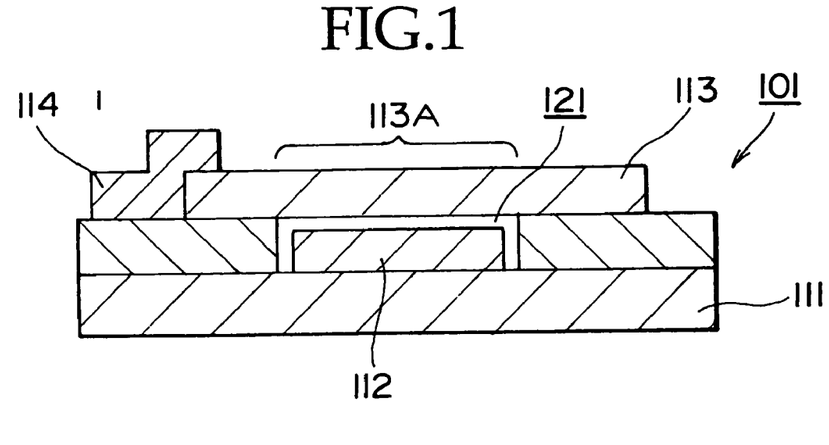
FIG. 1 is a sectional view showing a schematic configuration of a conventional high frequency filter.

A conventional technology of a high frequency filter for radio communication is now described with reference to FIG. 1. As shown in FIG. 1, a microvibrator 101 has a configuration as described below. A vibrator electrode 113 is arranged, through a space 121, above an output electrode 112 provided on a substrate 111. An input electrode 114 is connected to the vibrator electrode 113.

Next, operations of the microvibrator 101 are described below. When a specific frequency voltage is applied to the input electrode 114, a beam (a vibration part) 113A of the vibrator electrode 113 arranged above the output electrode 112 through the space 121 vibrates at a natural vibration frequency. A capacitance of a capacitor formed by the space 121 between the output electrode 112 and the beam (the vibration part) 113A is changed by the vibrations of the beam 113A, and this is outputted from the output electrode 112 as a voltage (See the Non-patent document 1, for instance). A high frequency filter comprising the microvibrator 101 having the above configuration enables higher Q factors to be obtained, as compared with a high frequency filter utilizing Surface Acoustic Wave (which will be hereinafter referred to as SAW) or Film Bulk Acoustic Resonator (which will be hereinafter referred to as FBAR).

A method of producing the above-described microvibrator is exemplified with reference to FIGS. 2A to 2E.

Figure 2A:
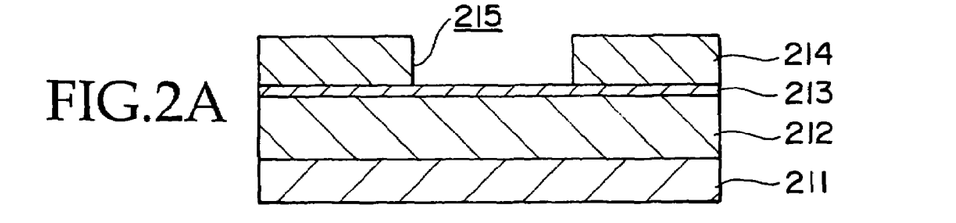
FIG. 2A is a sectional view showing a fabrication process of the conventional high frequency filter.

As shown in FIG. 2A, a silicon oxide film 212, a silicon nitride film 213 and a silicon oxide film 214 are sequentially formed at a silicon substrate 211. Next, a trench 215 that is to form an output electrode is formed at the silicon oxide film 214 using ordinary lithography and etching technologies.

Figure 2B:
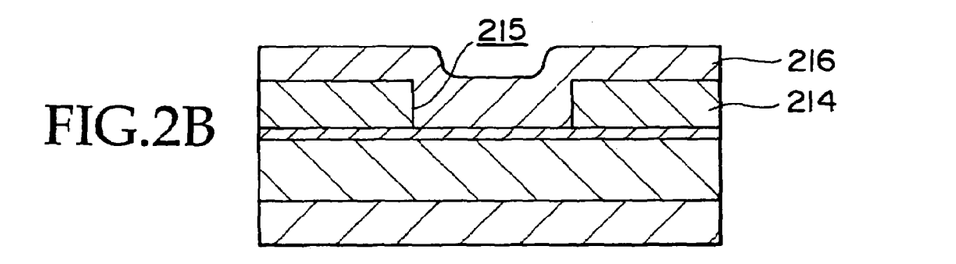
FIG. 2B is a sectional view showing a fabrication process of the conventional high frequency filter.
Figure 2C:
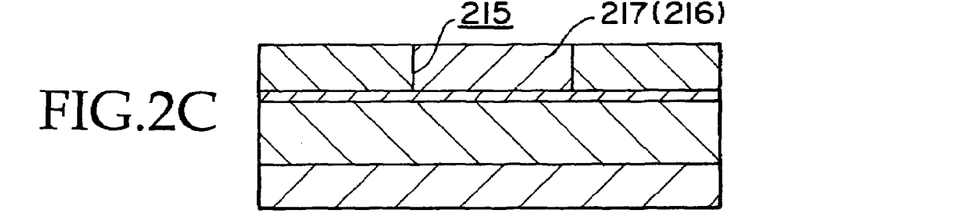
FIG. 2C is a sectional view showing a fabrication process of the conventional high frequency filter.

Next, as shown in FIG. 2B, a polysilicon film 216 that works as the output electrode is formed at the silicon oxide film 214 so as to fill up the trench 215. Thereafter, the polysilicon film 216 on the silicon oxide film 214 is polished using Chemical Mechanical Planarization (CMP) to be an output electrode 217 that is obtained with the polysilicon film 216 left only in the trench 215, as shown in FIG. 2C.

Figure 2D:
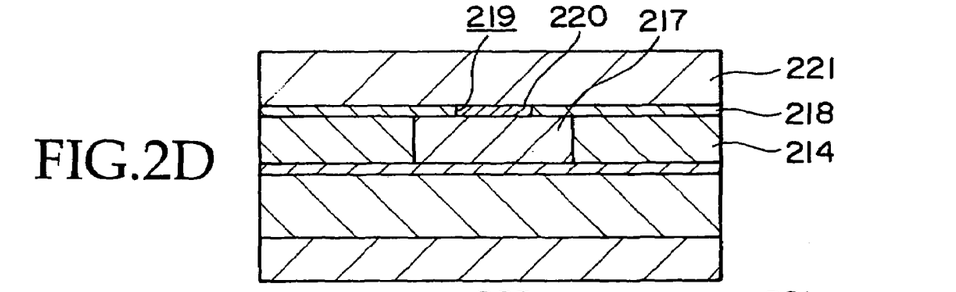
FIG. 2D is a sectional view showing a fabrication process of the conventional high frequency filter.

Next, as shown in FIG. 2D, a silicon nitride film 218 that covers the output electrode 217 is formed on the silicon oxide film 214. Then, an opening 219 is formed in the silicon nitride film 218 on the output electrode 217 using the lithography and etching technologies. In addition, a sacrifice film 220 comprising a silicon oxide film is formed so as to fill up the opening 219. At this time, planarization of the sacrifice film 220 is carried out using polishing or the like so that the sacrifice film 220 may have the same surface as that of the silicon nitride film 218. Thereafter, a vibrator electrode 221 is formed so as to cross the sacrifice film 220.

Figure 2E:
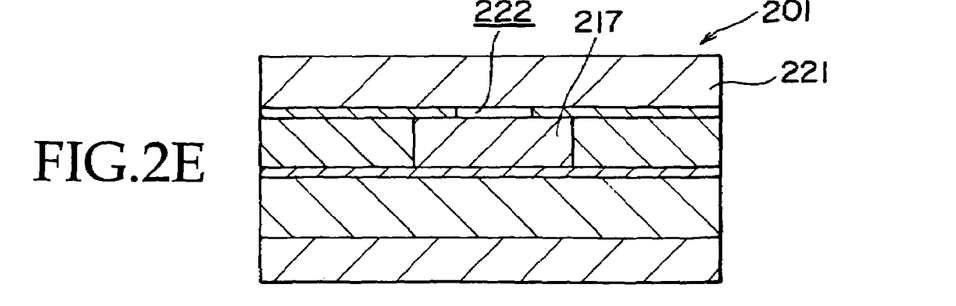
FIG. 2E is a sectional view showing a fabrication process of the conventional high frequency filter.

Next, as shown in FIG. 2E, the sacrifice film 220 (refer to FIG. 2D described above) is removed selectively by etching to form a space 222 between the vibrator electrode 221 and the output electrode 217. Thereafter, an input electrode (not shown) that is to be connected to the vibrator electrode 221 is formed. In this manner, a microvibrator 201 is fabricated.

[Non-patent document 1]

C. T. -C. Nguyen, "Micromechanical components for miniaturized low-power communications (invited plenary)," proceedings, 1999 IEEE MTT-S International Microwave Symposium RF MEMS Workshop, Jun. 18, 1999, P.48-77.

Figure 3:
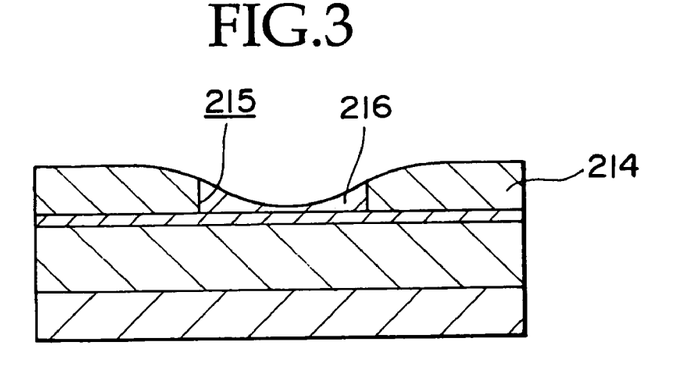
FIG. 3 is a sectional view of a configuration showing a problem in a conventional high frequency filter production method.

However, in the above-described conventional production method, when forming the output electrode, removal of the polysilicon film on the silicon oxide film is carried out using polishing, after the polysilicon film has been buried in the trench. In this process, ideally, surface planarization is attained to permit a flat output electrode to be formed. However, practically, large dishing arises so that an output electrode of a desired shape is not obtainable. More specifically, as shown in FIG. 3, the dishing that causes the surface of the polysilicon film 216 to be largely shaved arises. The above dishing also causes the silicon oxide film 214 around the trench 215 to be shaved. When the above dishing arises, a space to be formed between the output electrode and the vibrator electrode is hardly formed according to a design value, and as a result, desired frequency characteristics are not obtainable. Particularly, when forming an output electrode having a width of several μm or more, the polysilicon film 216 is not allowed to remain as it is in a condition where the trench 215 is completely filled up with the polysilicon film 216. The above-described dishing problem is further growing particularly with an increase in a wide output electrode.

Figure 4:
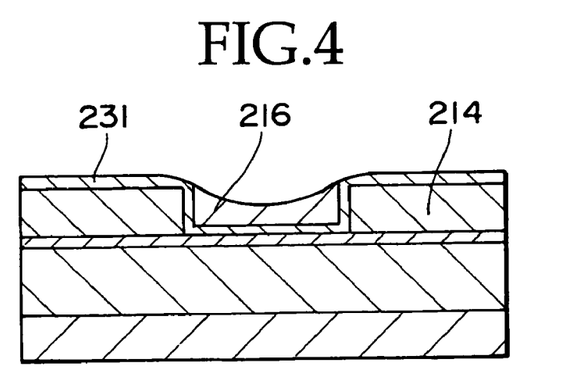
FIG. 4 is a sectional view of a configuration showing a problem in a different conventional high frequency filter production method.

Alternatively, to suppress the dishing of the polysilicon film, there may be used a different production method, wherein before or after formation of a trench that is to form an output electrode, a polishing stopper film comprising a silicon nitride film is formed on a silicon oxide film, and a polysilicon film that works as the output electrode is then buried in the trench. However, as shown in FIG. 4, even if a polishing stopper film 231 comprising the silicon nitride film is formed on the silicon oxide film 214, the dishing also arises at the time when the polysilicon film 216 is polished.

An extent of dishing of the polysilicon film in the presence of the polishing stopper film 231 is more reduced than that of the polysilicon film in the absence of the polishing stopper film 231 shown in FIG. 3. However, the above polishing stopper film is not sufficient to suppress the dishing, the space to be formed between the output electrode and the vibrator electrode is thus hardly formed according to the design value, and as a result, desired frequency characteristics are not obtainable.

Even if over-polishing has not been applied to remove the polysilicon film on the silicon oxide film completely, it was difficult to suppress the dishing in terms of characteristics of a pad or slurry used in polysilicon polishing.

SUMMARY OF THE INVENTION

The present invention has been undertaken to solve the above-described problems and is intended to provide a micromachine production method.

A micromachine production method according to the present invention comprises a step of forming, on a substrate, a first electrode having, on a surface, a stopper film, a step of forming, on the substrate, an insulating film to a thickness larger than that of the first electrode including the stopper film so as to cover the first electrode; a step of polishing the insulating film to expose the stopper film to the outside and also to planarize a polished surface; a step of forming an opening in the stopper film on the first electrode, then burying a sacrifice film in the opening and planarizing a surface of the sacrifice film in the same manner as for the surface of the insulating film; a step of forming a second electrode on the insulating film so as to cross over the sacrifice film; and a step of removing the sacrifice film to form a space between the first electrode and the second electrode.

In the above-described micromachine production method, after formation of the first electrode having, on the surface, the stopper film, the insulating film is formed to the thickness larger than that of the first electrode including the stopper film so as to cover the first electrode, and polishing of the insulating film is then carried out to expose the stopper film to the outside and also to planarize the polished surface, whereby the first electrode is not allowed to suffer dishing caused by the polishing. Further, after formation of the opening in the stopper film formed on the first electrode, the sacrifice film is buried in the opening, the second electrode is formed so as to cross over the sacrifice film, and removal of the sacrifice film is then carried out to form the space between the first electrode and the second electrode, whereby a gap between the first electrode and the second electrode may be determined by a thickness of the stopper film to ensure that a spatial electrode-to-electrode gap is obtainable with high accuracy.

Furthermore, the insulating film is formed with a High Density Plasma (which will be hereinafter referred to as HDP) silicon oxide film, whereby it is allowable to form the insulating film in an anisotropic deposition arrangement. More specifically, the deposition of the insulating film on the first electrode and the deposition of the insulating film on the substrate are carried out without being affected by each other. Thus, with the insulating film deposited on the substrate to a thickness approximately equal to that of the first electrode including the stopper film, the insulating film is deposited in the shape of trapezoidal section on the first electrode. The silicon oxide film formed using a High Density Plasma Chemical Vapor Deposition (which will be hereinafter referred to as HDP-CVD) process is specified as the above-described HDP silicon oxide film.

In this process, the insulating film is formed to the thickness larger than that of the first electrode including the stopper film, and a thickness of a larger thickness part of the insulating film is adjusted to 50 nm or less, whereby removal of the insulating film on the first electrode may be carried out selectively in the subsequent polishing. Further, after the removal of the insulating film on the first electrode to the same height as the second insulating film on the substrate, supply of polishing slurry is stopped. Thereafter, polishing requiring supply of only water, that is, water polishing is carried out, for instance, whereby in polishing the insulating film remaining on the first electrode, the whole surface of the insulating film may be polished into planarization without causing the dishing on the insulating film around the first electrode. By the way, when the thickness of the larger thickness part of the insulating film exceeds 50 nm, the result is an increase in thickness of the insulating film remaining on the first electrode after the polishing of the insulating film formed in the shape of trapezoidal section on the first electrode. Thus, the stopper film formed on the first electrode is hardly exposed to the outside by the water polishing. In this place, an application of polishing using the slurry leads to the dishing on the insulating film formed on the substrate, when the over-polishing was carried out. Accordingly, the thickness of the larger thickness part of the insulating film needs to be adjusted to 50 nm or less. On the other hand, when the thickness of the insulating film formed on the substrate is smaller than that of the first electrode including the stopper film, the insulating film surface including the stopper film surface is hardly planarized, as a matter of course.

Further, chemical mechanical planarization using cerium oxide slurry is applied to the polishing of the insulating film, whereby the polishing of the insulating film formed in the shape of trapezoidal section on the first electrode may be carried out without causing the dishing on the insulating film formed on the substrate. Thus, variations in thickness of the first electrode and the stopper film are solely confined within the limits of thickness variations created at the time of film deposition. As a result, the space between the first electrode and the second electrode on the first electrode may be obtained in a desired shape, and permits electric characteristics according to the design value to be obtained when the micromachine is used as a high frequency filter.

As described above, according to the micromachine production method of the present invention, after formation of the first electrode having, on the surface, the stopper film, the insulating film (the second insulating film) is formed, and the polishing of the second insulating film is carried out to planarize the second insulating film and also to expose the stopper film to the outside, so that no dishing is caused on the first electrode and the stopper film. The opening is formed in the stopper film on the first electrode, the sacrifice film is buried in the opening, the second electrode is formed on the sacrifice film and the removal of the sacrifice film is then carried out to form the space, so that the spatial gap between the first electrode and the second electrode may be obtained with high accuracy to ensure that the capacitor formed by the space and the first and second electrodes arranged with the space put therebetween is obtainable with high accuracy. Thus, when the micromachine is used as the high frequency filter, an accuracy of output from the first electrode due to the natural frequency of the second electrode that vibrates with the voltage applied thereto may be increased to ensure that desired excellent electric characteristics are obtainable.

The insulating film is formed with the HDP silicon oxide film, and the polishing of the insulating film is carried out using the cerium oxide slurry, so that the surface of the insulating film including the stopper film may be polished into planarization without causing the dishing on not only the first electrode but also the insulating film. In particular, when the insulating film is formed to the thickness larger than that of the first electrode including the stopper film, the thickness of the larger thickness part of the insulating film is adjusted to 50 nm or less. The above-described adjustment of the insulating film thickness facilitates the polishing of the insulating film on the stopper film and also permits the insulating film other than that on the stopper film on the substrate to be easily polished into planarization. Furthermore, the application of the chemical mechanical planarization requiring the supply of only water after the chemical mechanical planarization using the cerium oxide slurry enables higher accurate polishing into planarization.

BRIEF DESCRIPTION OF THE DRAWINGS

The features and advantages of the present invention will become more apparent in the following description of the presently preferred exemplary embodiment of the invention taken in conjunction with the accompanying drawings, in which.

DETAILED DESCRIPTION OF A PREFERRED EMBODIMENT

Figure 5A:
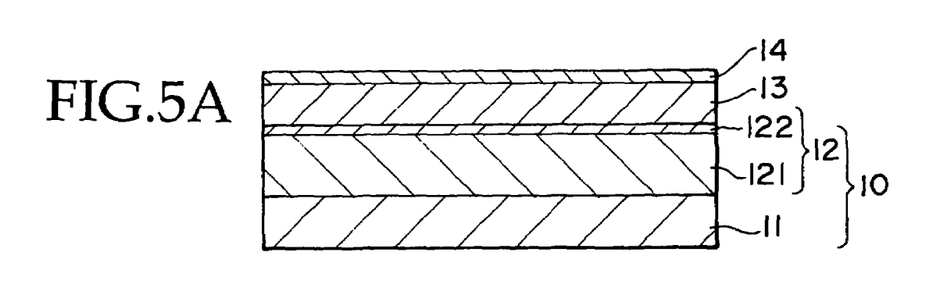
FIG. 5A is a sectional view of a fabrication process showing one embodiment of a micromachine production method according to the present invention.
Figure 5B:
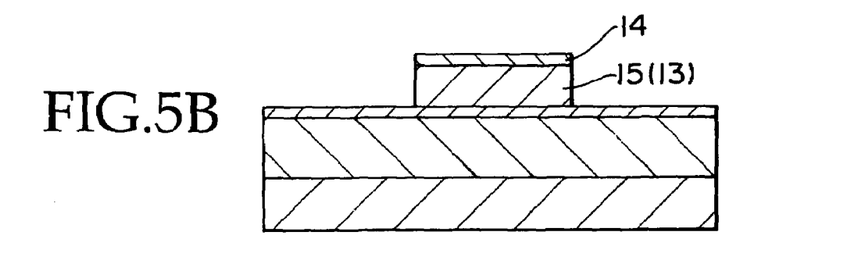
FIG. 5B is a sectional view of a fabrication process showing one embodiment of the micromachine production method according to the present invention.
Figure 5C:
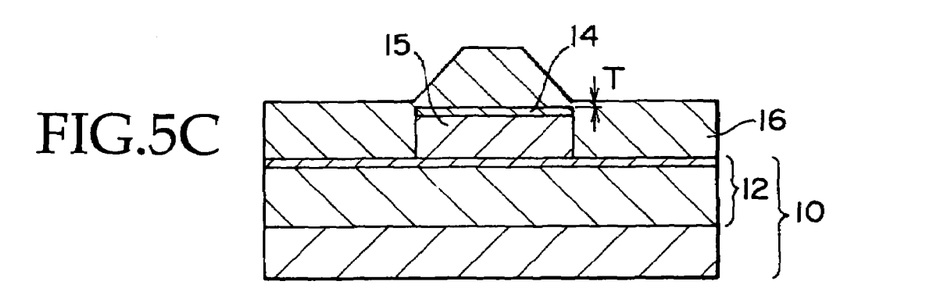
FIG. 5C is a sectional view of a fabrication process showing one embodiment of the micromachine production method according to the present invention.
Figure 5D:
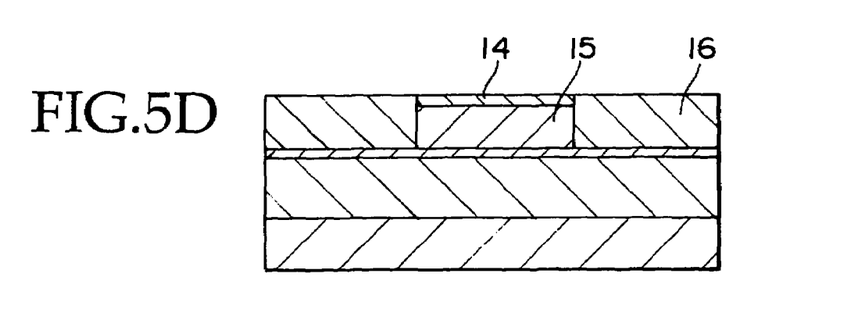
FIG. 5D is a sectional view of a fabrication process showing one embodiment of the micromachine production method according to the present invention.
Figure 5E:
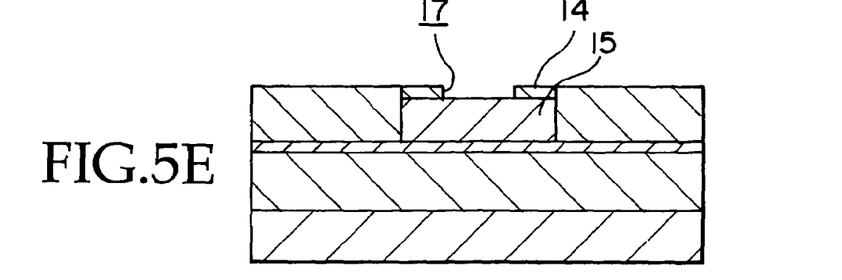
FIG. 5E is a sectional view of a fabrication process showing one embodiment of the micromachine production method according to the present invention.
Figure 5F:
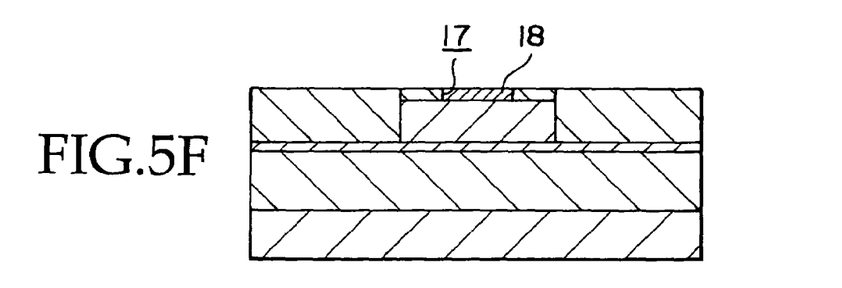
FIG. 5F is a sectional view of a fabrication process showing one embodiment of the micromachine production method according to the present invention.
Figure 5G:
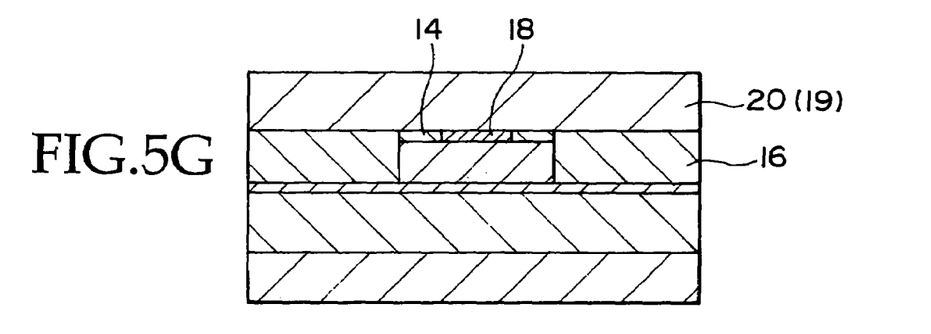
FIG. 5G is a sectional view of a fabrication process showing one embodiment of the micromachine production method according to the present invention.
Figure 5H:
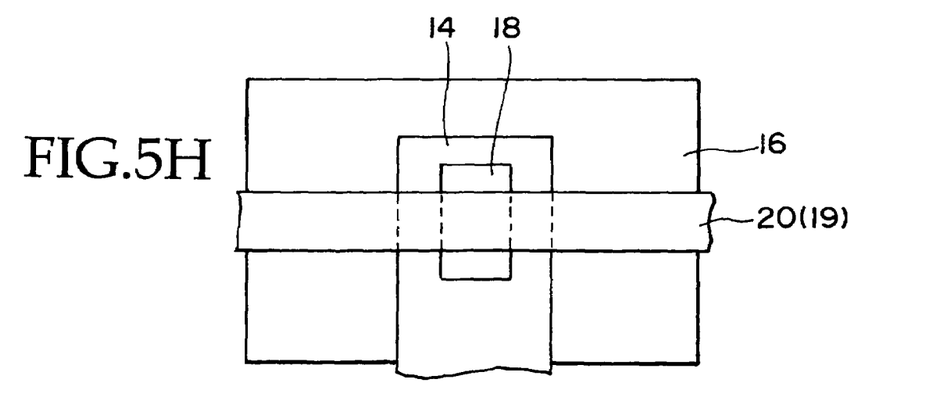
FIG. 5H is a top view of FIG. 5G.
Figure 5I:
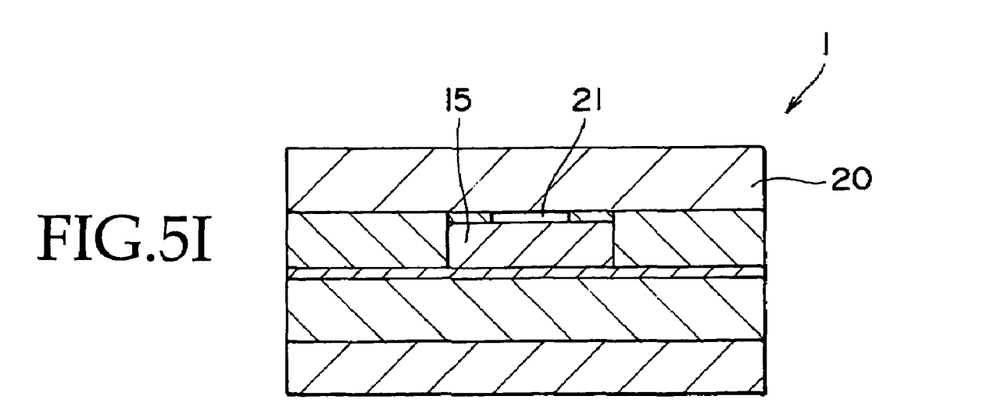
FIG. 5I is a sectional view showing a condition where a space 21 is formed between a second electrode 20 and a first electrode 15 by removing a sacrifice film 18 selectively by etching.
Figure 5J:
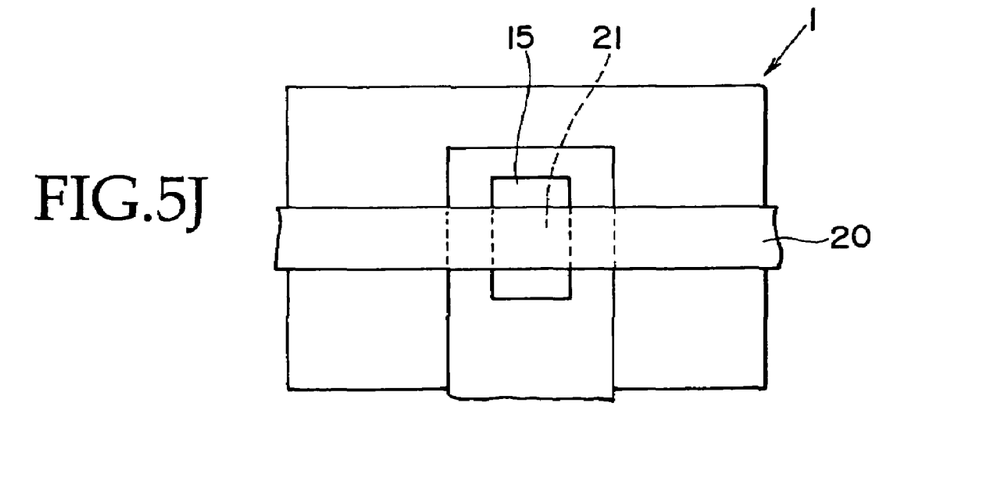
FIG. 5J is a top view of FIG. 5I.

One embodiment of a micromachine production method according to the present invention is now described with reference to FIGS. 5A to 5J showing fabrication processes, respectively. FIGS. 5A to 5G and 5I are sectional views showing a schematic configuration, and FIGS. 5H and 5J are plan layout views, respectively.

As shown in FIG. 5A, a first insulating film 12 is formed on a silicon substrate 11. The first insulating film 12 is obtained by an arrangement of a silicon oxide film 121 and a silicon nitride film 122 that are layered in this order from the bottom, for instance. In this manner, a substrate 10 having, on a surface, the insulating film is fabricated. Next, a conductive film 13 that is to form a first electrode is formed on the first insulating film 12. The conductive film 13 is formed with a polysilicon film, for instance. The polysilicon film may be obtained with a conductive material contained at the time of film deposition or with the conductive material doped after the film deposition. Further, a stopper film 14 is formed on the conductive film 13. The stopper film 14 is a film being formed to a thickness making a contribution to determination of a gap between a first electrode formed with the above conductive film and a second electrode to be formed later. In other words, the stopper film 14 works as a polishing stopper at the time of planarization polishing which is carried out later. The stopper film 14 is formed with a silicon nitride film, for instance.

Next, as shown in FIG. 5B, the stopper film 14 and the conductive film 13 are patterned using ordinary lithography and etching technologies (including a reactive ion etching technology, for instance) to form a first electrode 15. The first electrode 15 works as an output electrode.

Next, as shown in FIG. 5C, an insulating film (a second insulating film) 16 is formed on the substrate 10 (the first insulating film 12) so as to cover the first electrode 15 including the stopper film 14. The second insulating film 16 is preferably formed with a silicon oxide film using the HDP-CVD process. In the HDP-CVD process, deposition of the second insulating film 16 on the first electrode 15 and deposition of the second insulating film 16 on the substrate 10 are carried out without being affected by each other. Thus, with the second insulating film 16 deposited on the substrate 10 to a thickness approximately equal to that of the first electrode 15 including the stopper film 14, the second insulating film 16 is deposited in the shape of trapezoidal section on the first electrode 15. In this process, the second insulating film 16 is formed to a thickness larger than that of the first electrode 15 including the stopper film 14, and a thickness T of a larger thickness part of the second insulating film is adjusted to 50 nm or less.

Next, as shown in FIG. 5D, the second insulating film 16 on the first electrode 15 including the stopper film 14 is polished using the chemical mechanical planarization until the stopper film 14 is exposed to the outside. Requirements for the above polishing include use of cerium oxide slurry as polishing slurry. As the cerium oxide slurry, it is allowable to use a commercially available product. In addition, a foamed polyurethane resin-made pad was used as a polishing pad. As other requirements for the above polishing, a polishing pressure was specified as 300 hPa, a revolving speed of a polishing turntable with a polished object held was specified as 100 rpm, a revolving speed of a polishing head with the polishing pad held was specified as 107 rpm, a flow rate of slurry supplied was specified as 200 cm$^3$/min, and a polishing atmospheric temperature was specified as 25 to 30 degrees. In addition, over-polishing was carried out for 30 seconds in the polishing. In the over-polishing, the supply of slurry was stopped, and the polishing of the remaining second insulating film 16 with only water being supplied, that is, the water polishing was carried out with the stopper film 14—surface as a polishing stopper surface. As a result, the second insulating film 16 on the stopper film 14 was completely removed, so that the planarization of the surface of the second insulating film 16 including the surface of the stopper film 14 was attained.

Next, as shown in FIG. 5E, an opening 17 is formed in the stopper film 14 on the first electrode 15 using the ordinary lithography and etching technologies.

Next, as shown in FIG. 5F, a sacrifice film 18 is formed so as to fill up the opening 17. The sacrifice film 18 may be a film being subjected to etching selectively to the stopper film 14. In this process, the stopper film 14 formed with the silicon nitride film is provided, so that the sacrifice film 18 is formed with the silicon oxide film, for instance. The CVD process, for instance, may be applied to formation of the sacrifice film. The sacrifice film 18 is formed so as to fill up the opening 17 and also to deposit on regions (on the stopper film 14 and the second insulating film 16) other than the opening 17 using the CVD process. Thereafter, the planarization of the sacrifice film 18 is carried out using the polishing or the like so that the sacrifice film 18 may have the same surface as that of the stopper film 14. The chemical mechanical planarization, for instance, may be applied to the polishing of the sacrifice film, and it is preferable to carry out the polishing of the sacrifice film using a polishing method that is effective in suppressing the dishing of the sacrifice film 18. For instance, the polishing ensuring that the suppression of the dishing is attainable by means of the polishing using the cerium oxide slurry as described above is applicable.

Next, as shown in the sectional view of FIG. 5G and the plan layout view of FIG. 5H, the conductive film 19 that works as the second electrode is formed on the sacrifice film 18, the stopper film 14 and the second insulating film 16. The conductive film 19 is formed with a polysilicon film, for instance. The polysilicon film may be obtained with the conductive material contained at the time of the film deposition or with the conductive material doped after the film deposition. Next, the conductive film 19 is patterned so as to cross the sacrifice film 18 using the ordinary lithography and etching technologies (including the reactive ion etching technology, for instance) to form a second electrode 20. In this process, the sacrifice film 18 is in an exposed condition at the opposite sides of the second electrode 20. The second electrode 20 works as a vibrator electrode.

Thereafter, as shown in the plan layout views of FIG. 5I and FIG. 5J, the sacrifice film 18 (refer to FIG. 5G described above) is removed selectively by etching (isotropic etching), for instance to form a space 21 between the second electrode 20 and the first electrode 15. Thereafter, an input electrode (not shown) to be connected to one end of the second electrode 20 is formed. In this manner, a micromachine 1 is fabricated.

Next, operations of the micromachine 1 fabricated by the above production method is described briefly. When an application of the specific frequency voltage to the input electrode is made, the second electrode 20 specified as the vibrator electrode vibrates at the natural vibration frequency to permit the gap between the second electrode 20 and the first electrode 15 specified as the output electrode facing the second electrode 20 through the space 21 to change at the natural vibration frequency. With a change of the above gap, the capacitance of the capacitor formed by the space 21 between the second electrode 20 specified as the vibrator electrode and the first electrode 15 specified as the output electrode changes. A change of the capacitance of the capacitor leads to an output from the first electrode 15 as a voltage. The high frequency filter comprising the microvibrator having the above configuration enables higher Q factors to be obtained, as compared with the high frequency filter utilizing the SAW or FBAR.

In the above-described production method of the micromachine 1, after formation of the first electrode 15 having, on the surface, the stopper film 14, the second insulating film 16 that covers the first electrode 15 is formed to the thickness larger than that of the first electrode 15 including the stopper film 14, and the polishing of the second insulating film 16 is then carried out to planarize the polished surface and also to expose the stopper film 14 to the outside. The above process does not allow the first electrode 15 to suffer the dishing caused by the polishing. In addition, after formation of the opening 17 in the stopper film 14 formed on the first electrode 15, the sacrifice film 18 is buried in the opening 17, the second electrode 20 is formed so as to cross over the sacrifice film 18, and the removal of the sacrifice film 18 is then carried out to form the space 21 between the first electrode 15 and the second electrode 20. The above process allows the gap between the first electrode 15 and the second electrode 20 to be determined by the thickness of the stopper film 14 to ensure that the gap between a pair of electrodes is obtainable with accuracy.

In addition, the second insulating film 16 is formed with the HDP oxide silicon film, whereby it is allowable to form the second insulating film 16 in the anisotropic deposition arrangement. More specifically, the deposition of the second insulating film 16 on the first electrode 15 and deposition of the second insulating film 16 on the substrate 10 are carried out without being affected by each other. Thus, with the second insulating film 16 deposited on the substrate 10 to the thickness approximately equal to that of the first electrode 15 including the stopper film 14, the second insulating film 16 is deposited in the shape of trapezoidal section on the first electrode 15.

In this process, the second insulating film 16 is formed to the thickness larger than that of the first electrode 15 including the stopper film 14, and the thickness of the larger thickness part of the second insulating film is adjusted to 50 nm or less, whereby the removal of the second insulating film 16 on the first electrode 15 may be carried out selectively in the subsequent polishing. In addition, after the removal of the second insulating film 16 on the first electrode 15 to the height equal to that of the second insulating film 16 on the substrate 10, the supply of the polishing slurry is stopped, and the polishing requiring the supply of only water, that is, the water polishing is carried out, for instance, whereby in polishing the second insulating film 16 remaining on the first electrode 15, the whole surface of the second insulating film 16 may be polished into planarization without causing the dishing on the second insulating film 16 around the first electrode 15. By the way, when the thickness of the larger thickness part of the second insulating film 16 exceeds 50 nm, the result is an increase in thickness of the second insulating film 16 remaining on the first electrode 15 after the polishing of the second insulating film 16 formed in the shape of trapezoidal section on the first electrode 15, so that the stopper film 14 formed on the first electrode 15 is hardly exposed to the outside by the water polishing. In this process, the application of the polishing using the slurry leads to the dishing on the second insulating film 16 formed on the substrate 10, when the over-polishing was carried out. Thus, the thickness of the larger thickness part of the second insulating film 16 needs to be adjusted to 50 nm or less. On the other hand, when the thickness of the second insulting film 16 formed on the substrate 10 is smaller than that of the first electrode 15 including the stopper film 14, the surface of the second insulating film 16 including the surface of the stopper film 14 is hardly planarized, as a matter of course.

Further, the chemical mechanical planarization using the cerium oxide slurry is applied to the polishing of the second insulating film 16, so that the polishing of the second insulting film 16 formed in the shape of trapezoidal section on the first electrode 15 may be carried out without causing the dishing on the second insulating film 16 formed on the substrate 10. Accordingly, the variations in thickness of the first electrode 15 and the stopper film 14 are solely confined within the limits of thickness variations created at the time of the film deposition. As a result, the space 21 between the first electrode 15 and the second electrode 20 on the first electrode 15 may be obtained in the desired shape, and permits the electric characteristics according to the design value to be obtained when the micromachine 1 is used as the high frequency filter.

What is claimed is:

1. A micromachine production method comprising the steps of:

forming, on a substrate, a first electrode having, on a surface, a stopper film;

forming, on the substrate, an insulating film to a thickness larger than that of the first electrode including the stopper film so as to cover the first electrode and the stopper film, said insulating film formed to have a minimum thickness equal to or less than 50 nm;

polishing the insulating film to expose the stopper film to the outside and also to planarize a polished surface;

forming an opening in a portion of the stopper film on the first electrode, then burying a sacrifice film in the opening and planarizing a surface of the sacrifice film in the same manner as for the surface of the insulating film;

forming a vibrator electrode on the insulating film so as to cross over the sacrifice film; and removing the sacrifice film after forming the vibrator electrode to form a space between the first electrode and the vibrator electrode.

2. The micromachine production method as cited in claim 1, wherein;

said insulating film is formed with a High Density Plasma silicon oxide film.

3. The micromachine production method as cited in claim 1, wherein;

the polishing of the insulating film is carried out by chemical mechanical polishing using cerium oxide slurry.

4. The micromachine production method as cited in claim 3, wherein;

the polishing of the insulating film is carried out by applying chemical mechanical polishing while supplying only water after the chemical mechanical polishing using the cerium oxide slurry.

* * * * *